United States Patent
Chou et al.

(10) Patent No.: US 9,224,862 B2
(45) Date of Patent: Dec. 29, 2015

(54) HIGH VOLTAGE SEMICONDUCTOR DEVICE AND METHOD FOR FABRICATING THE SAME

(71) Applicant: Vanguard International Semiconductor Corporation, Hsinchu (TW)

(72) Inventors: Wei-Chun Chou, New Taipei (TW); Yi-Hung Chiu, Yilan (TW); Chu-Feng Chen, New Taipei (TW); Cheng-Yi Hsieh, Jhubei (TW); Chung-Ren Lao, Taichung (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 14/468,503

(22) Filed: Aug. 26, 2014

(65) Prior Publication Data

US 2015/0054071 A1    Feb. 26, 2015

Related U.S. Application Data

(62) Division of application No. 13/090,298, filed on Apr. 20, 2011, now Pat. No. 8,847,332.

(51) Int. Cl.
| | |
|---|---|
| *H01L 29/76* | (2006.01) |
| *H01L 29/78* | (2006.01) |
| *H01L 29/10* | (2006.01) |
| *H01L 29/66* | (2006.01) |
| H01L 29/08 | (2006.01) |
| H01L 29/423 | (2006.01) |

(52) U.S. Cl.
CPC ........ *H01L 29/7835* (2013.01); *H01L 29/1045* (2013.01); *H01L 29/1095* (2013.01); *H01L 29/66681* (2013.01); *H01L 29/66689* (2013.01); *H01L 29/7816* (2013.01); *H01L 29/086* (2013.01); *H01L 29/42368* (2013.01)

(58) Field of Classification Search
CPC ............ H01L 29/086; H01L 29/66681; H01L 29/7816

See application file for complete search history.

(56) References Cited

U.S. PATENT DOCUMENTS

| | | | |
|---|---|---|---|
| 5,585,660 | A | 12/1996 | Mei |
| 5,739,061 | A | 4/1998 | Kitamura et al. |
| 6,831,331 | B2 | 12/2004 | Kitamura et al. |
| 6,979,875 | B2 | 12/2005 | Kwon et al. |
| 7,575,977 | B2 | 8/2009 | Levin et al. |
| 8,159,001 | B2 | 4/2012 | Wang |

*Primary Examiner* — Thanh V Pham
(74) *Attorney, Agent, or Firm* — Birch, Stewart, Kolasch & Birch, LLP

(57) ABSTRACT

A high voltage semiconductor device is provided. The device includes a semiconductor substrate having a high voltage well with a first conductivity type therein. A gate structure is disposed on the semiconductor substrate of the high voltage well. A source doped region and a drain doped region are in the high voltage well on both sides of the gate structure, respectively. A lightly doped region with the first conductivity type is between the source and drain doped regions and relatively near to the source doped region. The disclosure also presents a method for fabricating a high voltage semiconductor device.

9 Claims, 9 Drawing Sheets

HIGH VOLTAGE SEMICONDUCTOR DEVICE AND METHOD FOR FABRICATING THE SAME

CROSS-REFERENCE TO RELATED APPLICATION

This application is a Divisional of U.S. application Ser. No. 13/090,298, filed on Apr. 20, 2011, now U.S. Pat. No. 8,847,332 B2, issued Sep. 30, 2014 the entire contents of which are hereby incorporated.

BACKGROUND OF THE INVENTION

1. Field of the Invention

The invention relates to a high voltage semiconductor device, and in particular to a laterally diffused metal oxide semiconductor (LDMOS) transistor and a method for fabricating the same.

2. Description of the Related Art

High voltage semiconductor technology is applied to integrated circuits with high voltages and high power. Traditional high voltage semiconductor devices, such as vertically diffused metal oxide semiconductor (VDMOS) transistors and LDMOS transistors are mainly used for devices with at least 18 volts or higher. The advantages of high voltage device technology include cost effectiveness and process compatibility, and thus high voltage device technology has been widely used in display driver IC devices, and power supply devices, and the power management, communications, autotronics, and industrial control fields, etc.

LDMOS transistors typically control current flowing between a drain and a source by a channel resulting from the gate voltage. In a traditional LDMOS transistor, the channel length must be extended in order to prevent source-drain punch-through effect. However, device size increases with increased channel length, thereby resulting in increased chip area and increased on resistance (Ron). Moreover, since the mobility of a hole carrier is lower than that of the electron carrier, the on resistance of a p-type diffused metal oxide semiconductor (PDMOS) transistor is higher than that of an n-type diffused metal oxide semiconductor (NDMOS) transistor, and this is detrimental for performance enhancement of PDMOS transistors.

Accordingly, there exists a need in the art for development of an improved high voltage semiconductor device structure, capable of mitigating or addressing the above-described problems.

BRIEF SUMMARY OF THE INVENTION

A detailed description is given in the following embodiments with reference to the accompanying drawings. A high voltage semiconductor device and a method for fabricating the same are provided. An exemplary embodiment of a high voltage semiconductor device comprises a semiconductor substrate having a high voltage well with a first conductivity type therein. A gate structure is disposed on the semiconductor substrate of the high voltage well. A source doped region and a drain doped region are in the high voltage well on both sides of the gate structure, respectively. A lightly doped region with the first conductivity type is between the source and drain doped regions and relatively near to the source doped region.

Another exemplary embodiment of a high voltage semiconductor device comprises an epitaxial layer with a first conductivity type formed on a semiconductor substrate, having a first high voltage well with a second conductivity type opposite to the first conductivity type therein. A gate structure is disposed on the epitaxial layer of the first high voltage well. A body doped region with the first conductivity type is in the first high voltage well on a first side of the gate structure. A source doped region is in the body doped region. A drain doped region is in the first high voltage well on a second side opposite to the first side of the gate structure. A first lightly doped region with the first conductivity type is in the body doped region and near to the source doped region.

An exemplary embodiment of a method for fabricating a high voltage semiconductor device comprises forming an epitaxial layer with a first conductivity type on a semiconductor substrate. A first high voltage well with a second conductivity type opposite to the first conductivity type is formed in the epitaxial layer. A body doped region with the first conductivity type is formed in the first high voltage well. A drain doped region is formed in the first high voltage well. A source doped region is formed in the body doped region. A gate structure is formed on the epitaxial layer of the first high voltage well, such that the body doped region and the drain doped region are in the first high voltage well on both sides of the gate structure. A first lightly doped region with the first conductivity type is in the body doped region and near to the source doped region.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

The embodiment of the invention provides a high voltage semiconductor device, such as an LDMOS transistor, which uses a halo or pocket implant region to mitigate the occurrence of the punch-through effect, thereby resulting in reduced on resistance (Ron) and reduced device size by shrinking the channel of the transistor.

Figure 1:
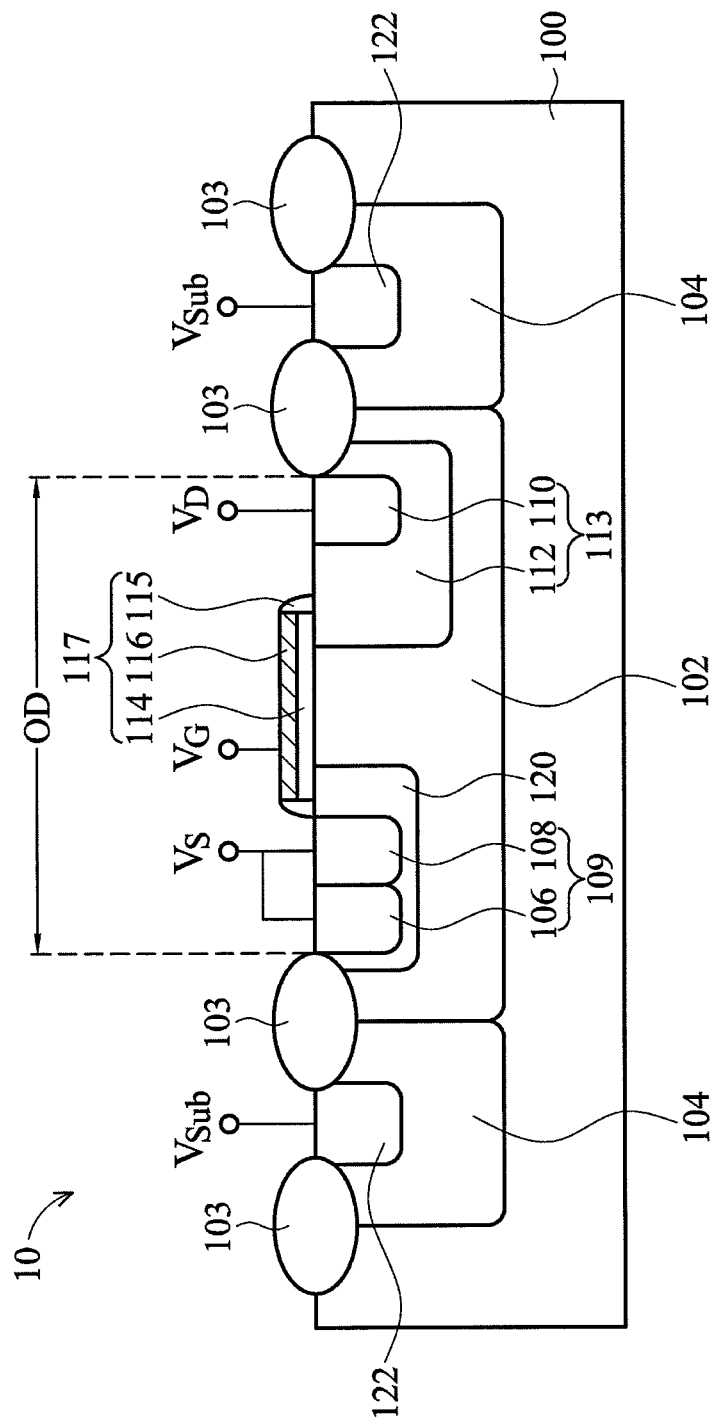
FIG. 1 is a cross section of an exemplary embodiment of a high voltage semiconductor device according to the invention.

Refer to FIG. 1, which illustrates a cross section of an exemplary embodiment of a high voltage semiconductor device 10 according to the invention. In the embodiment, the high voltage semiconductor device 10, such as an LDMOS transistor, comprises a semiconductor substrate 100 having an active region OD defined by an isolation structure 103. In the embodiment, the semiconductor substrate 100 may comprise silicon, SiGe, bulk semiconductor, compound semiconductor, silicon on insulator (SOI), or other commonly used semiconductor substrates. Moreover, the semiconductor substrate 100 may have a desired conductivity type by implanting p-type or n-type dopants. In one embodiment, the substrate 200 may be a P-type substrate. The isolation structure 103 may comprise local oxidation of silicon (LOCOS). In alternative embodiments, the isolation structure 103 may comprise a shallow trench isolation (STI) structure.

A high voltage well 102 with a first conductivity type is in the semiconductor substrate 100 of the active region OD.

A gate structure 117 is disposed on the semiconductor substrate 100 of the high voltage well 102. The gate structure 117 may comprise a gate dielectric layer 114 contacting the semiconductor substrate 100, a gate electrode 116 overlying the gate dielectric layer 114 and coupling to a gate voltage $V_G$, and gate spacers 115 on the sidewalls of the gate electrode 116.

A source doped region 109 and a drain doped region 113 are in the high voltage well 102 on both sides of the gate structure 117, respectively. In the embodiment, the source doped region 109 is coupled to a source voltage $V_S$ and may comprise a first heavily doped region 106 with a first conductivity type and a second heavily doped region 108 with a second conductivity type adjacent to the first heavily doped region 106, wherein the second conductivity type is opposite to the first conductivity type. In one embodiment, the first conductivity type is n-type and the second conductivity type is p-type. In an alternative embodiment, the first conductivity type is p-type and the second conductivity type is n-type. Moreover, the drain doped region 113 is coupled to a drain voltage $V_D$ and may comprise a double diffused region 112 with the second conductivity type and a third heavily doped region 110 with the second conductivity type in the double diffused region 112.

A well 104 with the second conductivity type is in the semiconductor substrate 100 and surrounds the high voltage well 102. The surface of the well 104 may have a fourth heavily doped region 122 with the second conductivity type and be coupled to a substrate voltage $V_{sub}$.

A lightly doped region 120 with the first conductivity type is between the source doped region 109 and the drain doped region 113 and is relatively near to the source doped region 109. In one embodiment, the lightly doped region 120 has a doping concentration in a range of $10^8/cm^2$ to $10^{16}/cm^2$ and may be formed by a halo implantation process, such that the lightly doped region 120 (i.e., halo implantation region) substantially surrounds the source doped region 109 (i.e., the first heavily doped region 106 and the second heavily doped region 108). Particularly, in the embodiment, the lightly doped region 120 can effectively reduce the leakage current causing a punch-through effect between the source and drain sides.

Figure 2:
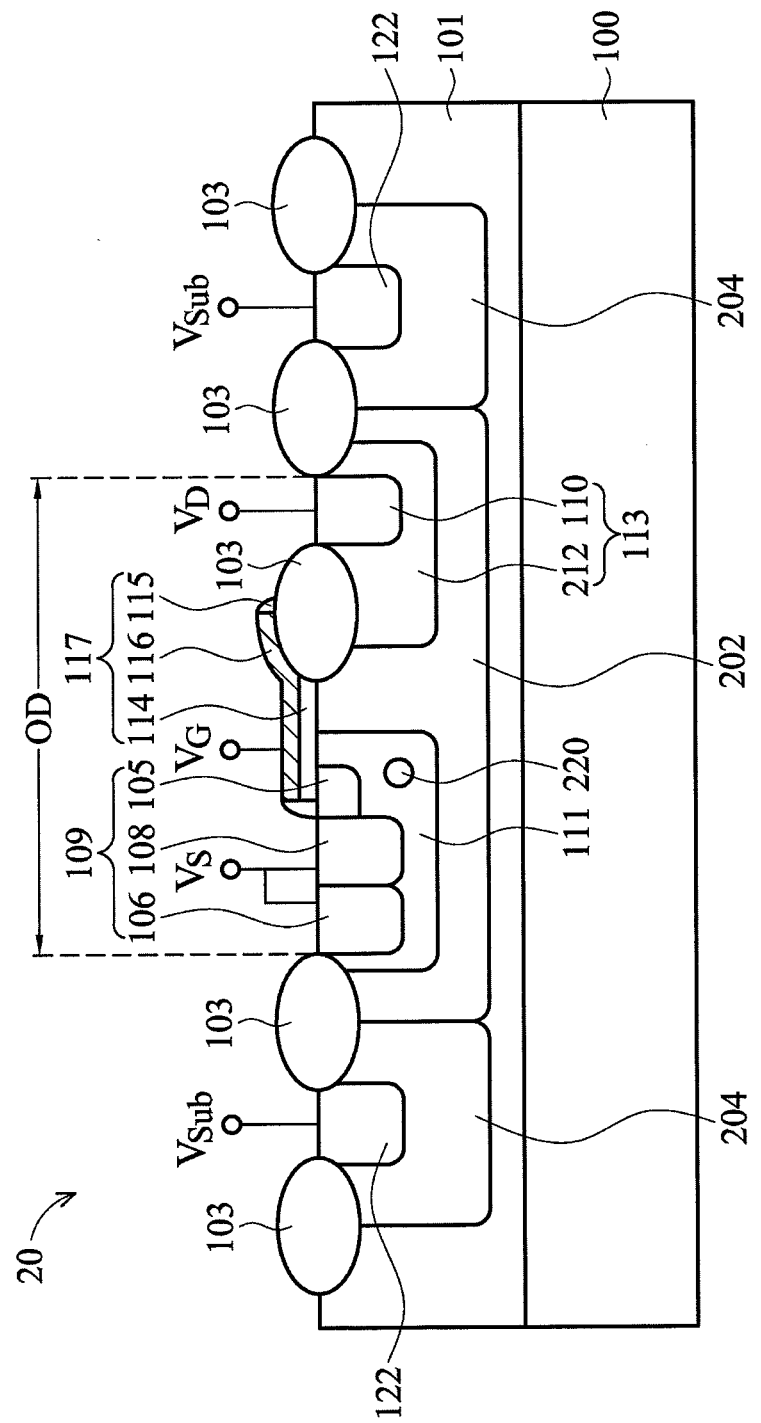
FIG. 2 is a cross section of another exemplary embodiment of a high voltage semiconductor device according to the invention.

Refer to FIG. 2, which illustrates a cross section of another exemplary embodiment of a high voltage semiconductor device 20 according to the invention. Elements in FIG. 2 that are the same as those in FIG. 1 are labeled with the same reference numbers as in FIG. 1 and are not described again for brevity. In the embodiment, the high voltage semiconductor device 20, such as an LDMOS transistor, comprises a semiconductor substrate 100 having an epitaxial layer 101 with a first conductivity type thereon. The epitaxial layer 101 may have the same conductivity type as that of the semiconductor substrate 100. Moreover, the epitaxial layer 101 has an active area OD defined by an isolation structure 103.

A first high voltage well 202 with a second conductivity type opposite to the first conductivity type is in the epitaxial layer 101 of the active area OD. In one embodiment, the first conductivity type is n-type and the second conductivity type is p-type. In an alternative embodiment, the first conductivity type is p-type and the second conductivity type is n-type.

A gate structure 117 is disposed on the epitaxial layer 101 of the first high voltage well 202 and is coupled to a gate voltage $V_G$. In the embodiment, gate electrode 116 of the gate structure 117 may extend above a portion of the isolation structure 103, as shown in FIG. 2.

A body doped region 111 with a first conductivity type is in the first high voltage well 202 on a first side of the gate structure 117. A source doped region 109 is in the body doped region 111 and is coupled to a source voltage $V_S$. Moreover, a first lightly doped region 220 with the first conductivity type is in the body doped region 111 and near to the source doped region 109. The first lightly doped region 220 has a doping concentration in a range of $10^8/cm^2$ to $10^{16}/cm^2$. In the embodiment, the source doped region 109 may comprise a first heavily doped region 106 with a first conductivity type and a second heavily doped region 108 with a second conductivity type adjacent to the first heavily doped region 106, and a second lightly doped region 105 with the second conductivity type adjacent to the second heavily doped region 108. In one embodiment, the first lightly doped region 220 may be formed by a pocket implantation process, such that the first lightly doped region 220 in the body doped region 111 is under the source doped region 109 or the second lightly doped region 105, and near to the second heavily doped region 108. Particularly, in the embodiment, the first lightly doped region 220 can effectively reduced the leakage current induced by a punch-through effect between the source and drain sides.

A drain doped region 113 is in the high voltage well 102 on a second side opposite to the first side of the gate structure 117. The drain doped region 113 is coupled to a drain voltage $V_D$ and may comprise a high voltage double diffused region 212 with the second conductivity type and a third heavily doped region 110 with the second conductivity type in the high voltage double diffused region 212.

A second high voltage well 204 with the second conductivity type is in the epitaxial layer 101 and surrounds the first high voltage well 202. The surface of the second high voltage well 204 may have a fourth heavily doped region 122 with the first conductivity type and be coupled to a substrate voltage $V_{sub}$.

Figure 3A:
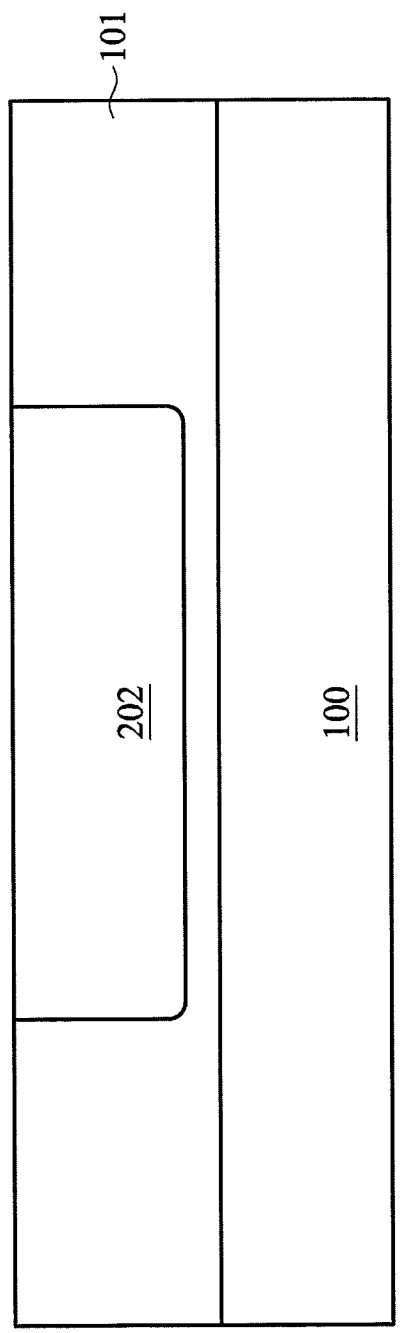
FIGS. 3A to 3G are cross sections of an exemplary embodiment of a method for fabricating a high voltage semiconductor device shown in FIG. 2.

FIGS. 3A to 3G are cross sections of an exemplary embodiment of a method for fabricating the high voltage semiconductor device 20 shown in FIG. 2. Referring to FIG. 3A, a semiconductor substrate 100 comprises silicon, SiGe, bulk semiconductor, compound semiconductor, silicon on insulator (SOI), or other commonly used semiconductor substrates. Moreover, the semiconductor substrate 100 may have a desired conductivity type by implanting p-type or n-type dopants. Next, an epitaxial layer 101 with a first conductivity type is formed on the semiconductor substrate 100, wherein the epitaxial layer 101 may have the same conductivity type as that of the semiconductor substrate 100 and may be formed by selective epitaxial growth methods.

Thereafter, a first high voltage well 202 with a second conductivity type opposite to the first conductivity type is formed in the epitaxial layer 101. In one embodiment, the first conductivity type is n-type and the second conductivity type is p-type. In an alternative embodiment, the first conductivity type is p-type and the second conductivity type is n-type. In the embodiment, dopants may be implanted into the epitaxial layer 101 by an ion implantation process followed by a thermal diffusion process to form the first high voltage well 202.

Figure 3B:
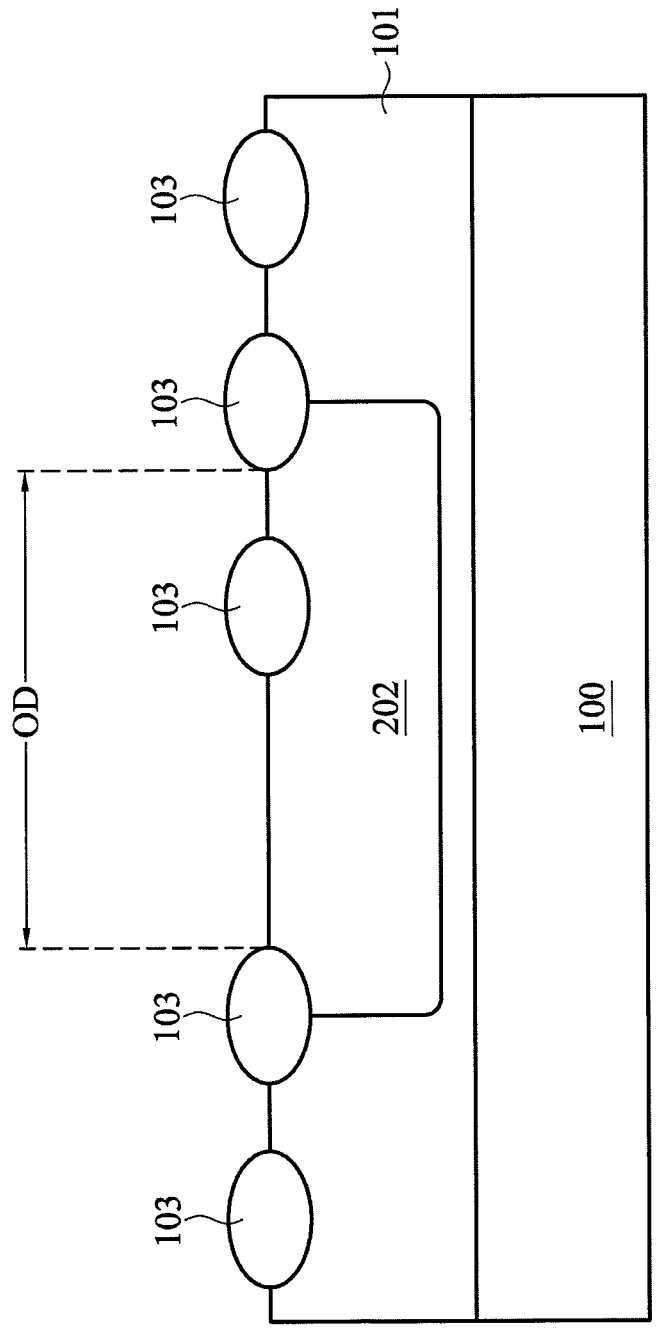

Referring to FIG. 3B, an isolation structure 103, such as local oxidation of silicon (LOCOS), is formed in the epitaxial layer 101 to define an active area OD corresponding to the first high voltage well 202. In alternative embodiments, the isolation structure 103 may comprise a shallow trench isolation (STI) structure.

Figure 3C:
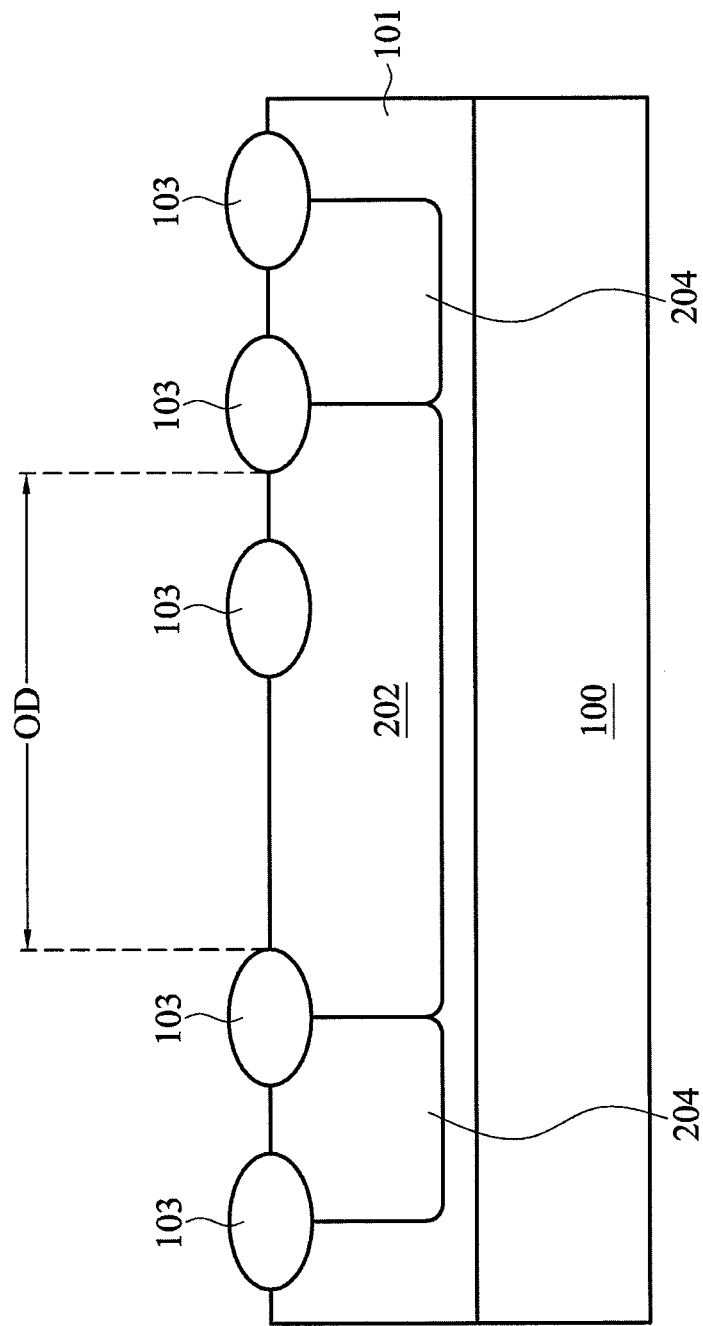

Referring to FIG. 3C, dopants may be implanted into the epitaxial layer 101 by an ion implantation process followed by thermal diffusion and annealing processes to form a second high voltage well 204 with the first conductivity type and surrounding the first high voltage well 202.

Figure 3D:
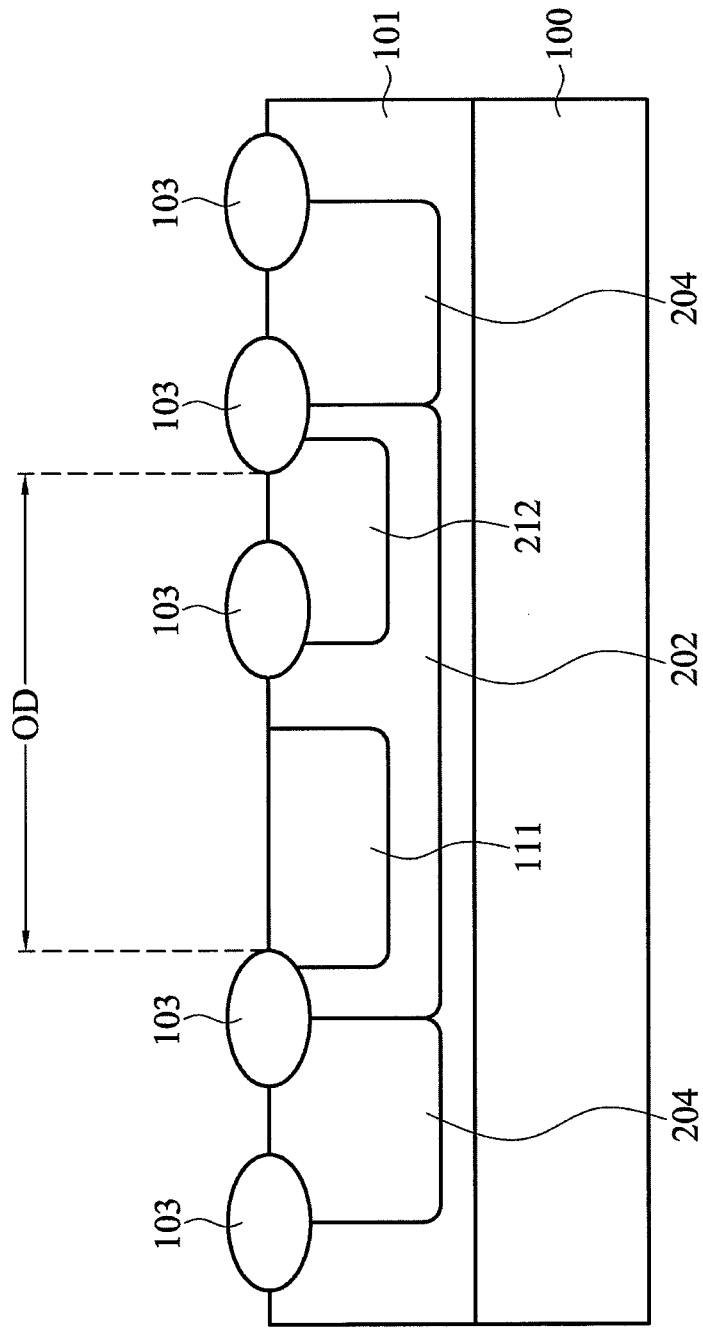

Referring to FIG. 3D, a body doped region 111 with the first conductivity type and a high voltage diffused region 212 with the second conductivity type are formed in the first high voltage well 202 by different ion implantation and thermal diffusion processes. The body doped region 111 and the high voltage diffused region 212 are spaced apart from each other by a predetermined distance.

Figure 3E:
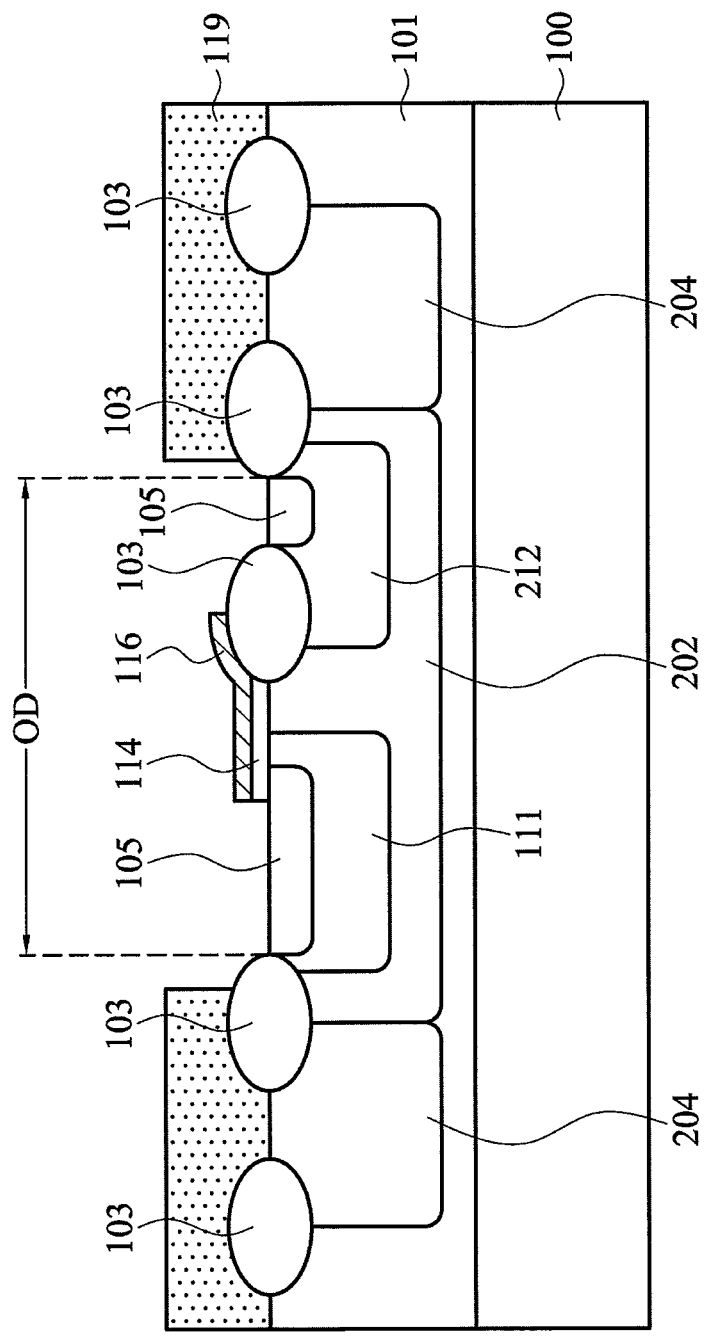

Referring to FIG. 3E, a gate dielectric layer 114, comprises oxide, nitride, oxynitride, oxycarbide or combinations thereof or other high-k (k>8) dielectric materials (for example, aluminum oxide ($Al_2O_3$), hafnium oxide ($HfO_2$), hafnium oxynitride (HfON), zirconium oxide ($ZrO_2$), zirconium oxynitride (ZrON) or combinations thereof. The gate dielectric layer 114 may be formed by a chemical vapor deposition (CVD) process or other well known deposition process. Next, a gate electrode 116 is formed on the gate dielectric layer 114 by a CVD process or other well known deposition process. The gate electrode 116 may comprise polysilicon or metal. Thereafter, the gate electrode 116 and the gate dielectric layer 114 are patterned by conventional lithography and etching processes. The patterned gate electrode 116 and gate dielectric layer 114 are substantially above the first high voltage well 202 between the body doped region 111 and the high voltage double diffused region 212 and partially cover the body doped region 111, the high voltage double diffused region 212, and the isolation structure 103.

Next, a photoresist pattern layer 119 is formed on the epitaxial layer 101 to expose the high voltage double diffused region 212 and a portion of the body doped region 111. Thereafter, lightly doped regions 105 with the second conductivity type are formed in the high voltage double diffused region 212 and the body doped region 111.

Figure 3F:
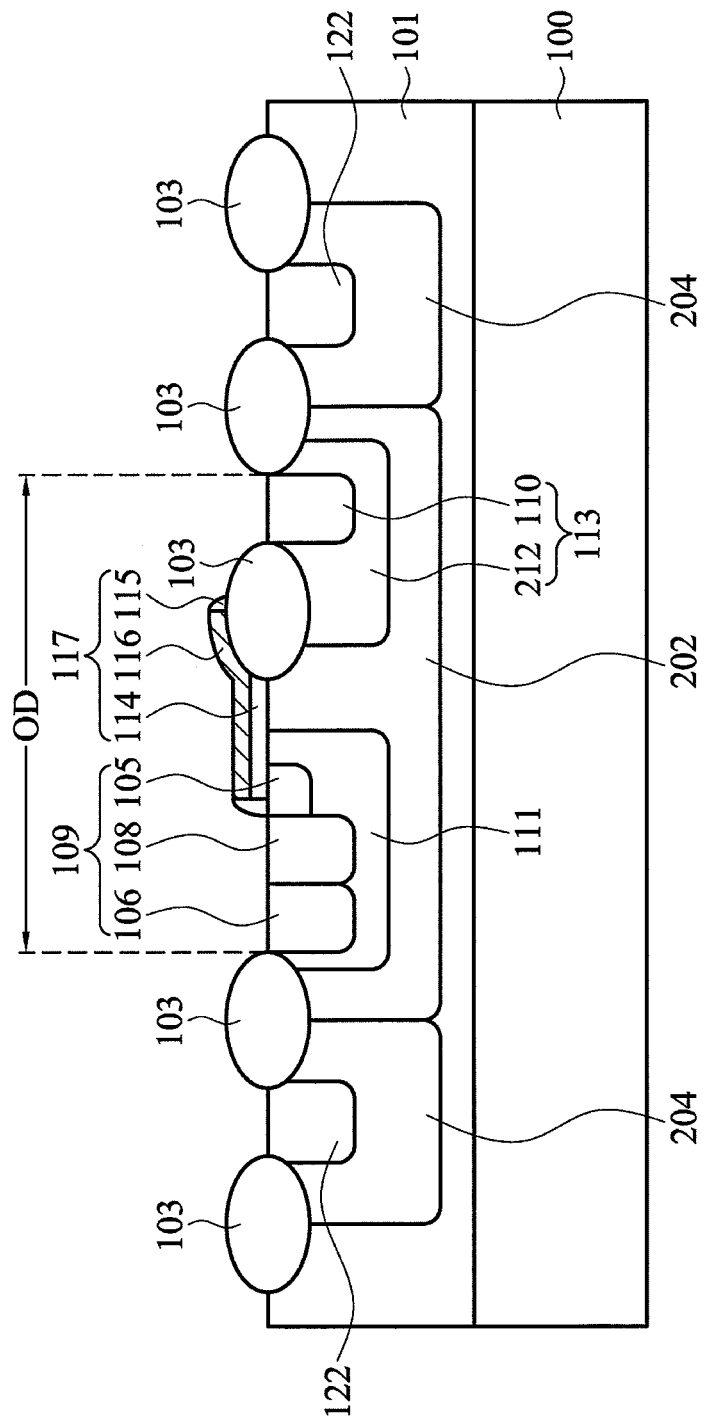

Referring to FIG. 3F, after removal of the photoresist pattern layer 119, gate spacers 115 are formed on the sidewalls of the gate electrode 116 and gate dielectric layer 114 to complete the fabrication of the gate structure 117. The gate spacers 115 may comprise oxide, nitride, oxynitride or a combination thereof, and may be formed by conventional deposition and anisotropic etching processes. After formation of the gate structure 117, a first heavily doped region 106 with the first conductivity type and a second heavily doped region 108 with the second conductivity type adjacent thereto are formed in the body doped region 111, a third heavily doped region 110 with the second conductivity type are formed in the high voltage double diffused region 212, and a fourth heavily doped region 122 with the first conductivity type is formed in the surface of the second high voltage well 204, by different ion implantation processes, respectively. The first heavily doped region 106, second heavily doped region 108, and lightly doped regions 105 form a source doped region 109, and the third heavily doped region 110 and high voltage double diffused region 212 form a drain doped region 113, such that the body doped region 111 and the drain doped region 113 are on both sides of the gate structure 117, respectively.

Figure 3G:
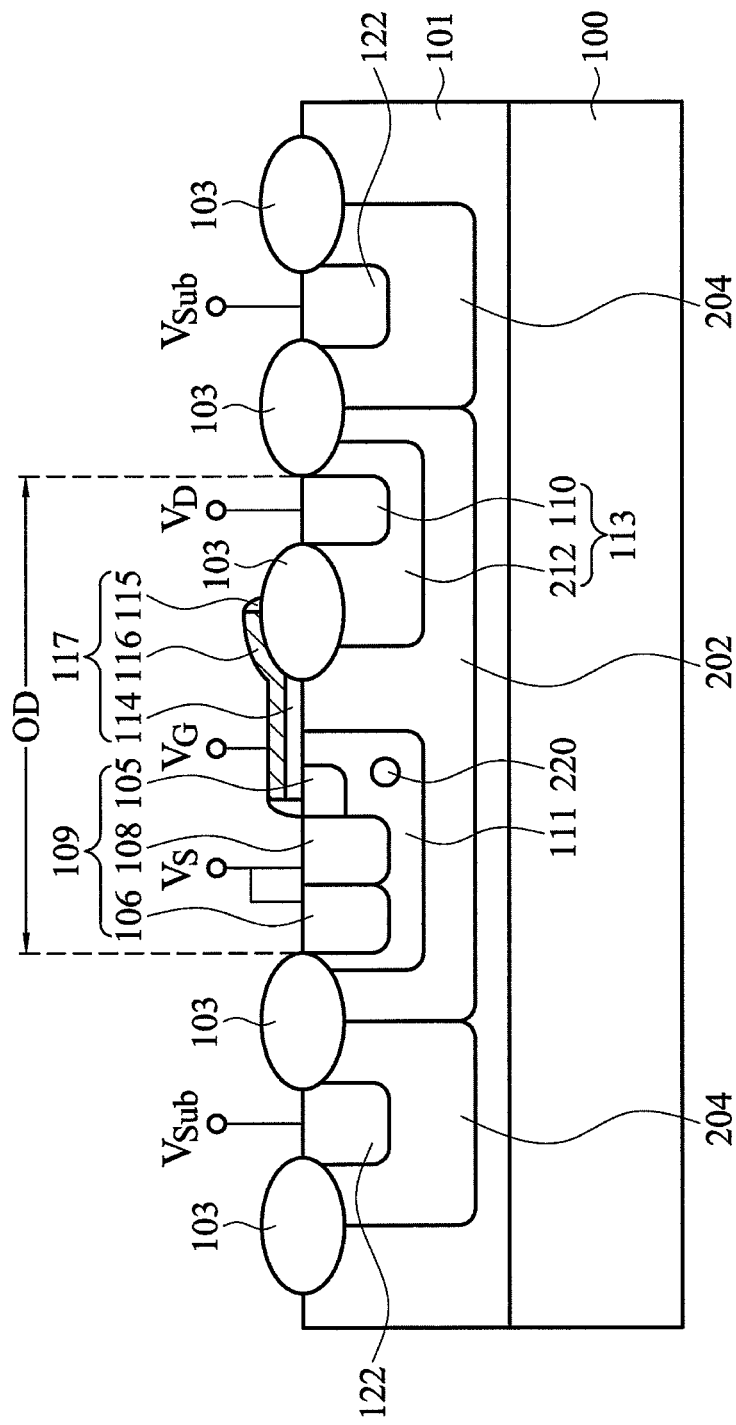

Referring to FIG. 3G, a lightly doped region 220 (i.e., pocket implantation region) with the first conductivity type may be formed in the body doped region 111 and near to the source doped region 109 by a pocket implantation process.

Following, the fabrication of the high voltage semiconductor device 20 is completed. In one embodiment, the lightly doped region 220 is in the body doped region 111 and under the lightly doped region 105. Moreover, the lightly doped region 222 is near to the second heavily doped region 108 and has a doping concentration in a range of $10^8/cm^2$ to $10^{16}/cm^2$. Additionally, and in particular, the ion implantation mask layer used for formation of the lightly doped region 220 and that used for formation of the lightly doped region 105 may be formed by using the same photomask for the respective lithography processes. Accordingly, additional manufacturing costs can be saved.

According to the foregoing embodiments, since the lightly doped region (halo implantation region) 120 and the lightly doped region (pocket implantation region) 220 is capable of effectively reducing leakage current causing a punch-through effect between the source and drain sides, the channel length of the high voltage semiconductor devices 10 and 20 can be properly reduced, thereby reducing the on resistances (Ron) and sizes of the high voltage semiconductor devices 10 and 20.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A high voltage semiconductor device, comprising:
an epitaxial layer with a first conductivity type formed on a semiconductor substrate, having a first high voltage well with a second conductivity type opposite to the first conductivity type therein;
a gate structure comprising a gate electrode and gate spacers on opposite sidewalls of the gate electrode disposed on the epitaxial layer of the first high voltage well;
a body doped region with the first conductivity type in the first high voltage well on a first side of the gate structure;
a source doped region in the body doped region;
a drain doped region in the first high voltage well on a second side opposite to the first side of the gate structure, the drain doped region comprises a double diffused region; and
a first lightly doped region with the first conductivity type in the body doped region and near to the source doped region, and
wherein one of the gate spacers is in direct contact with the first lightly doped region and the other of the gate spacers is in direct contact with the double diffused region.

2. The device of claim 1, wherein the source doped region comprises a first heavily doped region with the first conductivity type and a second heavily doped region with the second conductivity type adjacent thereto, and the drain region comprises a high voltage double diffused region with the second conductivity type and a third heavily doped region with the second conductivity type therein.

3. The device of claim 2, wherein the source doped region further comprises a second lightly doped region with the second conductivity type in the body doped region above the first lightly doped region and adjacent to the second heavily doped region.

4. The device of claim 2, further comprising a second high voltage well with the first conductivity type in the epitaxial layer and surrounding the first high voltage well.

5. The device of claim 4, wherein the surface of the second high voltage well has a fourth heavily doped region with the first conductivity type.

6. The device of claim 2, wherein the first lightly doped region is adjacent to the second heavily doped region and has a doping concentration in a range of $10^8/cm^2$ to $10^{16}/cm^2$.

7. The device of claim 1, wherein the body doped region has a doping concentration in a range of $10^8/cm^2$ to $10^{16}/cm^2$.

8. The device of claim 1, wherein the first conductivity type is n-type and the second conductivity type is p-type.

9. The device of claim 1, wherein the first conductivity type is p-type and the second conductivity type is n-type.

\* \* \* \* \*